United States Patent [19]
Su et al.

[11] Patent Number: 6,149,784
[45] Date of Patent: Nov. 21, 2000

[54] SPUTTERING CHAMBER SHIELD PROMOTING RELIABLE PLASMA IGNITION

[75] Inventors: Jingang Su, Sunnyvale; Nelson A. Yee, Redwood City; John C. Forster, San Francisco; Kenny King-Tai Ngan, Fremont; Lisa L. Yang, San Jose, all of Calif.

[73] Assignee: Applied Materials, Inc., Santa Clara, Calif.

[21] Appl. No.: 09/425,583

[22] Filed: Oct. 22, 1999

[51] Int. Cl.[7] .................................................... C23C 14/34
[52] U.S. Cl. ................... 204/298.11; 204/192.12
[58] Field of Search ........................... 204/298.11, 192.12

[56] References Cited

U.S. PATENT DOCUMENTS 5,736,021  4/1998  Ding et al. .......................... 204/298.11
5,824,197  10/1998  Tanaka ................................ 204/192.12

*Primary Examiner*—Nam Nguyen
*Assistant Examiner*—Gregg Cantelmo
*Attorney, Agent, or Firm*—Charles S. Guenzer

[57] ABSTRACT

A shield for a DC magnetron sputtering reactor, particularly advantageous for reliably igniting the plasma used in sputtering a ferromagnetic material such as cobalt or nickel. The grounded shield includes a slanted portion separated from the beveled periphery of the target by a small gap operating as a dark space. The shield also includes a straight cylindrical portion surrounding the main processing area. The slanted portion is joined to the cylindrical portion at a knee According to one embodiment of the invention, the knee is located greater than 9 mm from the face of the target and at a radial position at least 1 mm inward of the outer periphery of the target face.

25 Claims, 2 Drawing Sheets

SPUTTERING CHAMBER SHIELD PROMOTING RELIABLE PLASMA IGNITION

FIELD OF THE INVENTION

The invention relates generally to plasma sputtering reactors. In particular, the invention relates to a chamber shield used to promote sputtering and to protect the side of the chamber.

BACKGROUND ART

Sputtering, alternatively called physical vapor deposition (PVD), is the favored technique for depositing materials, particularly metals and metal-based materials, in the fabrication of semiconductor integrated circuits. Sputtering has a high deposition rate and, in most cases, uses relatively simple and inexpensive fabrication equipment and relatively inexpensive material precursors, targets in the case of PVD. The usual type of sputtering used in commercial applications is DC magnetron sputtering, which is limited to the sputtering of metallic target. Sputtering is widely used for the deposition of aluminum (Al) to form metallization levels in semiconductor integrated circuits. More recently, copper deposition by PVD has been developed. However, sputtering is applicable to a wider range of materials useful in the fabrication of semiconductor integrated circuits. Reactive sputtering is well known in which a target of a metal, such as titanium or tantalum, is sputtered in the presence of a reactive gas in the plasma, most typically nitrogen. Thereby, the sputtered metal atoms react with the reactive gas to deposit a metal compound on the wafer, most particularly, a metal nitride, such as titanium nitride using a titanium target in a nitrogen ambient or tantalum nitride using a tantalum target in a nitrogen ambient.

Sputtering of yet other metals is also important in the fabrication of semiconductor integrated circuits. In a conventional process to contact a metallization of, for example, aluminum to silicon, a thin layer of titanium, typically of thickness less than 15 mm, is deposited over narrow source and drain portions of a silicon substrate which have previously been implanted with p-type or n-type dopants such as boron or phosphorous. The wafer is then annealed, such as by rapid thermal processing (RTP), to cause the titanium and silicon near their interface to diffuse together to form a silicide, in this case titanium suicide. The silicide promotes the adhesion of metallization afterwards deposited over the silicide and also provides a more ohmic contact between the metallization and the semiconducting silicon.

Titanium-based silicides, usually in the form of $TiSi_2$, however, have some limitations. The temperature required to react titanium with silicon to form the suicide is relatively high, in the range of 600 to 900° C. dependent upon the characteristics required. This is a relatively high temperature and may deleteriously cause the implanted dopants to diffuse away from the intended region of the junction. Furthermore, titanium silicide has shown a tendency to increase its resistivity as it is deposited into increasingly narrow source and drain widths. An acceptably low sheet resistance of $4\Omega/\square$ is obtained at a line width of 1 µm, but the sheet resistance increases to about $20\Omega/\square$ at 0.3 µm.

For these reasons, alternative suicides have been considered. Both cobalt and nickel suicides offer much promise. Their siliciding temperatures are lower by 50 to 200° C. They introduce less stress during the siliciding process. Their dependence of resistivity upon line width is negligible. Nickel silicide (NiSi) has some potential advantages in its low resistivity, low stress, and low consumption of silicon during siliciding. However, it has not been favored because it is stable only to about 750° C., versus 900° for $TiSi_2$ and 1000° with $CoSi_2$. For these reasons, cobalt silicide has been more extensively investigated as a replacement for titanium silicide.

Cobalt can be sputtered in a DC magnetron sputter reactor of the type illustrated schematically in FIG. 1.

A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed through a ceramic isolator 14 to a PVD target 16 composed of the material, usually a metal, to be sputter deposited on a wafer 18 held on a heater pedestal electrode 20 by a wafer clamp 22. Alternatively to the wafer clamp 22, an electrostatic chuck may be incorporated into the pedestal 20. The target material may be aluminum, copper, aluminum, titanium, tantalum, alloys of these metals or with alloying elements of up to a few percentages, or other metals amenable to DC sputtering. A shield 24 held within the chamber protects the chamber wall 12 from the sputtered material and provides the anode grounding plane. A selectable and controllable DC power supply 26 negatively biases the target 16 to about −600VDC with respect to the shield 24. Conventionally, the pedestal 20 and hence the wafer 18 are left electrically floating, but it nonetheless develops some DC self-bias to attract positively charged ions from the plasma.

A first gas source 34 supplies a sputtering working gas, typically argon, to the chamber 12 through a mass flow controller 36. The can working gas can be admitted from various positions with the chamber 12 including from the bottom, as illustrated, with one or more inlet pipes supplying gas at the back of the shield. The gas penetrates the bottom of the shield 24 or through a gap 42 between the wafer clamp 22 and the shield 24 and the pedestal 20. A vacuum system 44 connected to the chamber 12 through a wide pumping port 46 maintains interior of the chamber 12 at a low pressure. Although the base pressure can be held to about $10^{-7}$ Torr or even lower, the conventional pressure of the argon working gas is typically maintained at between about 1 and 1000 mTorr. A computer-based controller 48 controls the reactor including the DC power supply 26 and the mass flow controller 36.

When the argon is admitted into the chamber, the DC voltage applied between the target 16 and the shield 24 ignites the argon into a plasma, and the positively charged argon ions are attracted to the negatively charged target 16. The ions strike the target 16 at a substantial energy and cause target atoms or atomic clusters to be sputtered from the target 16. Some of the target particles strike the wafer 18 and are thereby deposited on it, thereby forming a film of the target material.

To provide efficient sputtering, a magnetron 50 is positioned in back of the target 14. It has opposed magnets 52, 54 coupled by a magnetic yoke 56 producing a magnetic field within the chamber in the neighborhood of the magnets 52, 54. The magnetic field traps electrons and, for charge neutrality, the ion density also increases to form a high-density plasma region 58 within the chamber adjacent to the magnetron 50. To achieve full coverage in sputtering of the target 14, the magnetron 50 is usually rotated about the center 60 of the target 14 by a shaft 62 driven by an unillustrated motor.

Sputtering of the very thin cobalt layer needed for siliciding does not require a high deposition rate nor, as a result, a significantly high plasma density in the region beneath the magnetron. Therefore, the target power may be set to less than 1 kW for a 200 mm wafer, compared to 20 kW or more for some types of aluminum or copper sputtering. For such thin layers required for siliciding, the layer thickness must be carefully controlled so that excessive silicon is not consumed in the siliciding process. Lower power for sputtering thin cobalt layers improves the thickness control.

Sputtering of cobalt, though, presents some fundamentally different problems from the sputtering of aluminum, copper, or titanium. Cobalt is a ferromagnetic material. As a result, the magnetic field produced by the magnetron is at least partially shunted through the cobalt target and does not contribute to the formation of the high-density plasma region. Some diminution of the plasma density because of the reduced magnetic flux beneath the magnetron is not a major problem for cobalt sputtering because the cobalt deposition rate need not be all that high. However, ignition of the plasma with a ferromagnetic target does present a problem.

Plasma ignition can present a significant problem, especially in the geometries representative of a commercially significant plasma reactor. The initial excitation of a plasma requires a high voltage, though with essentially no current, to cause the working gas to be excited into the electrons and positive ions of an electron. This condition must persist for a time period and over a space sufficient to support a low-resistance, essentially neutral plasma between the two electrodes in the case of a capacitively coupled plasma. The maintenance of a plasma requires a feedback condition in which at least as many argon atoms, if argon is the dominant gas, are excited into ions and electrons as are lost. Electron loss to the walls is the usual limiting factor. If too many electrons are lost, the plasma collapses or is never formed.

It has been observed that plasma ignition with a cobalt plasma is very unreliable. Often ignition requires as much time as would be expended in the actual deposition of cobalt and requires several attempts at the ignition sequence.

Hence, it is greatly desired that a means be provided for reliably igniting the plasma for sputtering cobalt and other materials, particularly ferromagnetic materials.

SUMMARY OF THE INVENTION

A chamber shield for use in a DC magnetron plasma sputter reactor has a form favoring an extended dark space between the shield and the target. The shield extends downwardly from the target inside of the chamber walls to protect the walls from being coated with sputtered material. The shield is typically grounded with respect to the negatively biased target and thus also acts as an anode for the plasma discharge.

The shield includes a slanted portion separated by a small constant gap from beveled edges on the side of the targets. The gap is small enough to act as a dark space preventing a plasma from forming across the dark space. The shield also includes a straight cylindrical portion extending between the target and wafer inside the chamber walls. The slanted portion transitions to the straight portion at a knee. According to the invention, the knee is disposed further away from the target than is normal for aluminum and copper sputtering, preferably more than 9 mm and less than 20 mm.

DETAILED DESCRIPTION OF THE PREFERRED EMBODIMENTS

Figure 1:
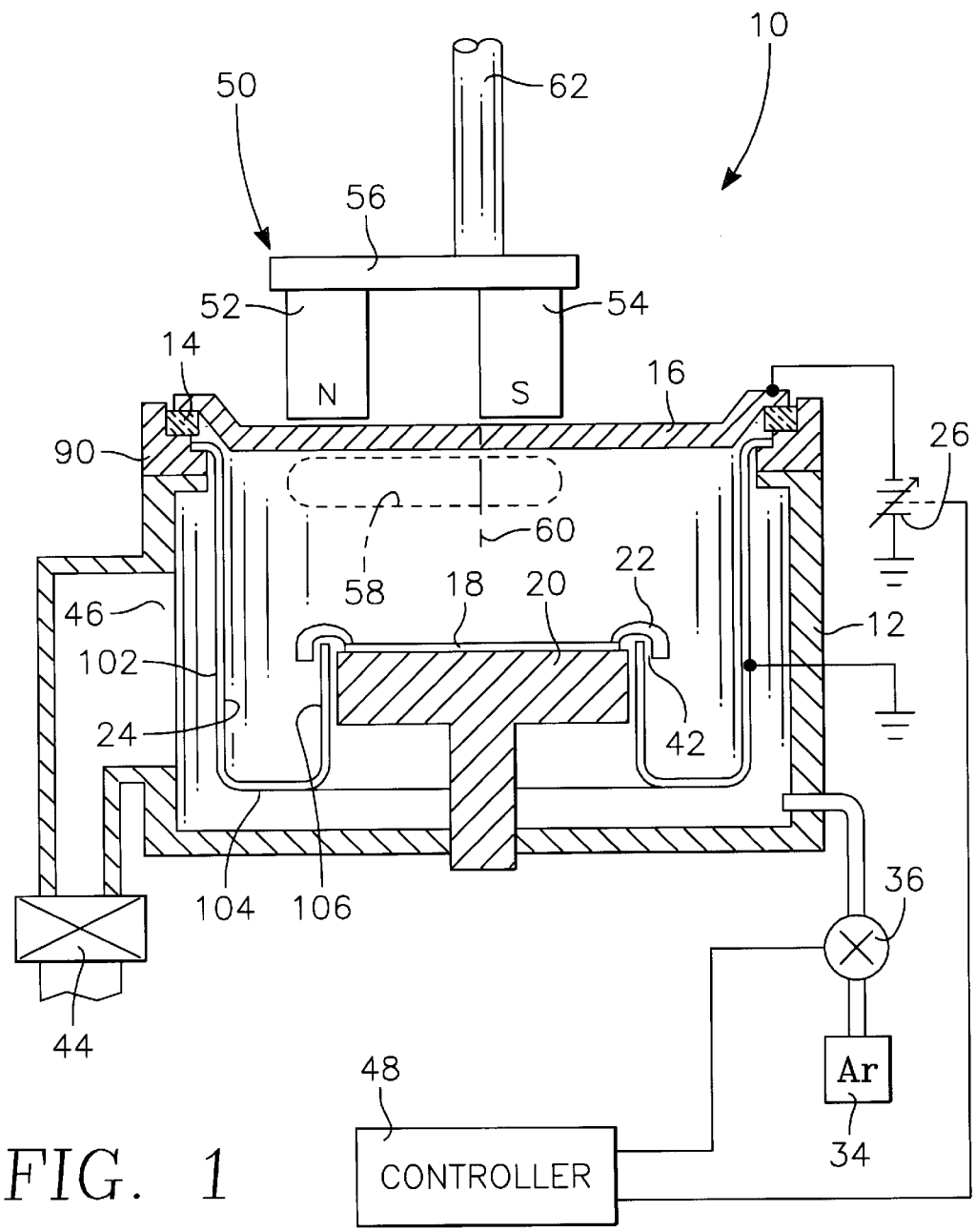
FIG. 1 is a cross-sectional view of a DC magnetron sputter reactor.

The ignition of a plasma even with non-magnetic targets requires some care. The DC power source 26 illustrated in FIG. 1 is typically a relatively complex electronic power supply system. It must be capable of supplying DC power of relatively high voltages but virtually no current during the ignition phase and then switching to supply DC power of reduced voltages but relatively high current after the plasma has ignited. An ignition voltage of −150VDC is typical in commercial DC sputter reactors of the illustrated geometry.

Cobalt is usually deposited as part of a barrier or other interfacial layer, and thus its required thickness is relatively small. Therefore, sputtering deposition rates for cobalt are kept relatively low to better control the deposition thickness. Between about 500 to 1000 W of DC power is typically used during the deposition stage to sputter deposit cobalt onto 200 mm wafers. For wafers of other sizes, the power generally scales with the wafer area although deposition rates also depend upon other chamber characteristics. The power is typically supplied with a voltage of about −450VDC to −480VDC at a current in the vicinity of 2 to 5 A. At these sputtering powers, cobalt of the desired thickness can be deposited in about 15 s. The switching between these two modes is done partially by a soft output stage of the DC power supply 26 and partially by active control circuitry, which measures the current being supplied.

Furthermore, for igniting a plasma with a cobalt target, the ignition sequence repetitively pulses the supplied DC voltage between zero and −150VDC with a pulsing period of between 100 and 200 ms. If during any pulse, the current rises above a predetermined level indicating plasma ignition, the ignition sequence is stopped, and the output of the DC power supply 26 is switched to the deposition mode.

However, with cobalt targets, it has been observed than 4 to 10 seconds of ignition pulsing is often required. Sometimes, even after the lapse of 10 seconds, a plasma has failed to ignite, and a system fault may be declared requiring operator intervention. We believe that ignition is compromised by a concentration of electron loss at the corner of the target just inside of the dark space gap as the electrons are grounded to the shield. As a result, an insufficient volume of argon is ionized, particularly far away from the chamber wall shield.

Figure 2:
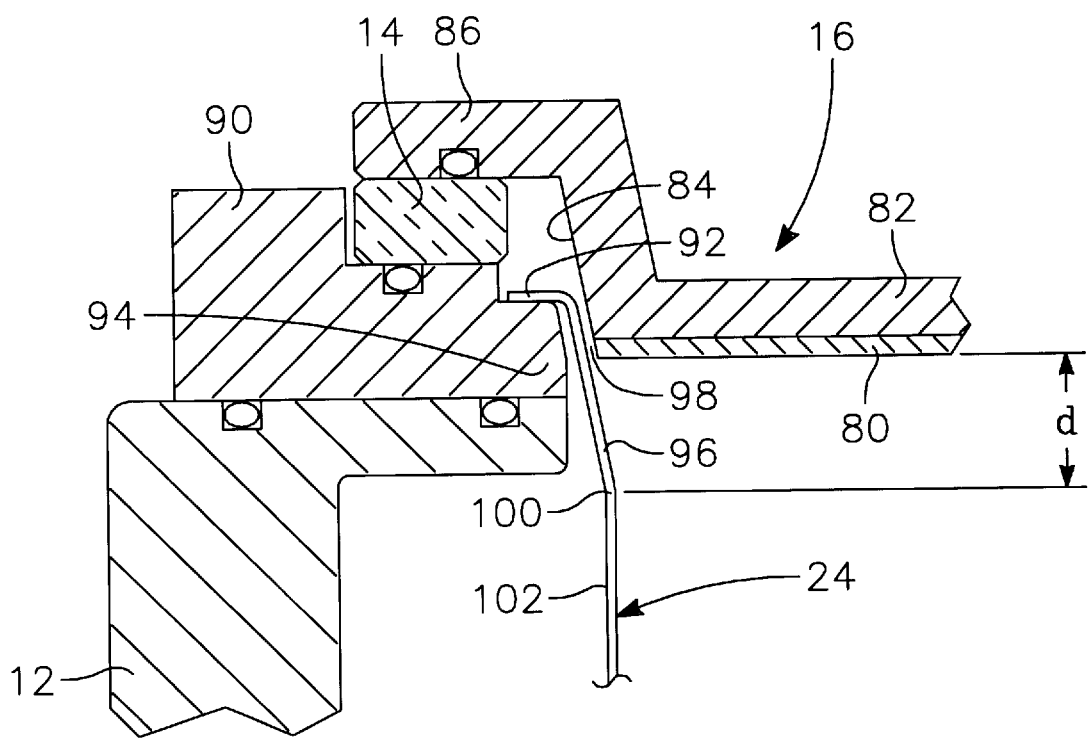
FIG. 2 is a cross-sectional view of an embodiment of a plasma sputtering shield of the invention usable with the sputter reactor of FIG. 1.

The cross-sectional view of FIG. 2 illustrates the region around the junction between the target 16 and the chamber wall 12. This figure illustrates neither the rotatable magnetron nor the cooling water bath used for sputtering cobalt. A cobalt target layer 80 is solder bonded or otherwise connected to a backing plate 82 composed of, for example, aluminum or copper. Both the target layer 80 and the backing plate 82 are formed with a bevel 84 inclined at about 15° outwardly from the front to the back of the target 14. The bevel angle may be designed to other values between 5° and 45°. The target backing plate 82 includes a rim 86 that is vacuum sealed to the ceramic isolator 14 providing electrical isolation between the powered target 16 and the grounded chamber wall 12. The isolator 14 is vacuum sealed to an aluminum adapter 90, which in turn is sealed to and electrically connected to the aluminum chamber wall 12. The adapter 90 provides flexibility in setting the distance between the target 16 and the wafer 18 and restricts wear to a less expensive and more easily replaced part.

The shield 24 has an annular outer lip 92 resting on an inner ledge 94 of the adaptor 90 and is electrically connected to the adaptor 90 to be thereby electrically grounded. The shield 24 also includes a slanted portion 96 depending from the shield lip 92 and formed at the bevel angle of the target 16 to form a gap 98 between the slanted portion 96 of the shield 24 and the target 16. An exemplary thickness of the gap 98 is 80 mils (2 mm). The gap 98 conveniently assumes a constant thickness when the slanted portion 96 and the target bevel 84 are fabricated with conical shapes.

The slanted portion 96 extends downwardly and inwardly to a knee 100 below which the shield is formed in a cylindrically shaped straight portion 102. The knee 100 is located a distance d below the bottom of the target 16. When there is a gradual transition between the slanted and straight portions 96, 102, the knee is defined as the top of the straight portion 102.

As illustrated in FIG. 1, the straight portion 102 of the shield 24 extends several centimeters below the elevation of the wafer 18 before extending horizontally inwardly in a bowl portion 104 and then upwardly in another cylindrical portion 106, which terminates just below the level of the wafer 18 supported at the process position. The outer straight portion 102 acts as the anode for the plasma sputtering process. The shield 24 is typically composed of stainless steel, and its interior side may be bead blasted or coated with arc-sprayed aluminum to provide a rougher surface. Sputter deposited material adheres more strongly to a roughened surface, thereby reducing the potential of flaking of material deposited on the shield during the sputtering process.

The gap 98 between the slanted portion 96 of the shield 24 and the target 16 forms a dark space because the gap 98 is thin enough at all positions adjacent the target 16 at the chamber pressures being used that no plasma is supported in the dark space 98. The effect is evident from an inspection of the well known Paschen's curve which shows a minimum of the voltage needed to strike a plasma as a function of the product of pressure and the gap size between electrodes. The dark space thus prevents a plasma from forming between the target cathode 16 and the grounded shield 24 in areas where the cathode 16 and shield 24 are separated by only a short distance. A plasma can form in areas of larger separations, but this occurs in the plasma processing area and contributes to the sputtering. The absence of a plasma in the dark space at the side of the target prevents that area of the target from being sputtered, in particular, the backing plate 82 which has a different composition than the material desired to be sputter deposited.

The plasma ignition requires that a large number of electrons be emitted from the face of the target and that they ionize the argon gas and start the cascade of excitations resulting in the formation of the argon plasma. If during the ignition process, an excessive number of electrons are transported from the edge of the target to the upper part of the shield 24, their path is relatively short and they do not have an adequate opportunity to interact with the argon gas and ionize it sufficiently into a plasma. The electron path during ignition must be made longer on average so as to increase the interaction of the electrons and the argon atoms, which results in plasma ignition. Furthermore, if the dark space at the side of the target is too narrow, the dark current on the target side is much larger, thus draining electrons from the target face.

The structure as already described above is conventional. For one type of shield used in sputtering aluminum, the shield knee 100 is located a distance d of about 3 mm below the target 16. Such a shield has proven unsatisfactory for cobalt sputtering. We believe the problem is that with a high shield knee 100 relatively close to the target 16, the straight portion 102 below the knee 100 quickly becomes relatively far from the target 16. As a result, the electrons from the target mainly travel to the portion of the shield above the knee 100, and the volume of argon through which the electrons are transported is relatively small. Consequently, the electron loss from the forming plasma is concentrated near the outer periphery of the target 16 and involves too little argon to reliably result in ignition. We believe reliable ignition is promoted when the electron loss during ignition is spread over a larger target area. When the shield knee 100 is lowered, there is a larger portion of the shield 24 above the knee 100 to which the electrons are attracted and from a larger area of the target 80. As a result, there is more argon in the electron path, and the argon is thereby more reliably ignited into a plasma. Although we believe the above explanation explains the behavior we observed, our invention is not limited by the above theory of its operation.

In order to make the ignition more reliable, the depth of the shield knee 100 below the target face should be increased above the 3 mm of the prior art. Two shields have been fabricated for use with a planar target diameter of 329 mm at its bottom face between the bevels, a diameter appropriate for sputtering onto a 200 mm wafer. The first shield has a knee 100 at 9 mm below the target 16 and an inner diameter inside of the straight shield portion 102 of 327 mm. The second shield has a knee at 21 mm and an inner diameter of 323 mm.

The shield with the 21 mm knee has been tested for ignition with a cobalt target and an argon chamber pressure of 3.85 milliTorr. It produces no ignition delays. An ignition delay is defined as more than 3 s of the previously described pulsing being required to ignite the plasma. In most cases, the plasma is struck in less than 1 s. We have observed some ignition delays with the two different shields having 9 mm knees. We believe a shield with a 3 mm knee will perform worse than that with the 9 mm knee. At an intermediate value of, for example, 15 mm, satisfactory performance should also be obtained.

Accordingly, it is preferred that the sputtering shield have a knee located at least 9 mm away from the target, more preferably at least 15 mm, and most preferably at least 21 mm. Alternatively stated, the knee should be located at a radial position with respect to the target center of more than 1 mm inside the planar periphery of the target. It is preferred that the knee not be located more than 40 mm, more preferably not more than 30 mm, from the target and no more than 1 cm radially inwardly of the target edge because of diminishing effects and target shadowing. Furthermore, an excessively low knee pinches the plasma too much inwardly and prevents sputtering from the target edge.

The placement of the shield knee further away from the target face and inwardly of the target edge is also related to the knee placement relative to the magnetron. Since the magnetron creates the magnetic field lines that trap electrons and thus extends the plasma, the low and inward placement of shield knee pushes the plasma inwardly and extends it further from the target. Both effects promote ignition and ion transport to the wafer, but excessive pinching to the point of producing non-uniform target sputtering needs to be avoided.

Although the invention has been tested with a cobalt target, it should be equally applicable to sputtering from targets of other ferromagnetic materials, such as nickel or nickel-chromium. It is of course understood, that alloying of the target materials by a few weight percent is not unusual, alloying percentages of less than 5 or 10 wt % being typical. However, even broader ferromagnetic alloy systems may advantageously use the invention. Ferromagnetic materials incorporating rare-earth metals are also being developed for semiconductor wafer fabrication. Such metals are also ferromagnetic. The shield of the invention may also be used with non-ferromagnetic materials, even the common aluminum and copper.

Although the shield in the described example was grounded, it may be held at another predetermined DC potential with the same effects. Furthermore, electrically floating shields are sometimes used adjacent to the target.

The invention thus increases the efficiency of sputtering, particularly reliability of plasma ignition, with on minor changes of a simple chamber part.

What is claimed is:

1. A metal shield for use in a sputter reactor including a target having a planar face and a beveled outer periphery, said shield comprising a slanted portion extending along and apart from the beveled outer periphery to form a plasma dark space and a straight portion extending away from said target and in a direction perpendicular to said planar face and joined to said slanted portion by a knee, wherein said knee is located at least 9 mm from said planar face.

2. The shield of claim 1, wherein said target includes a ferromagnetic target portion.

3. The shield of claim 2, wherein said ferromagnetic target portion comprises cobalt.

4. The shield of claim 1, wherein said slanted portion is substantially conically shaped.

5. The shield of claim 1, wherein said knee is located at least 21 mm from said planar face.

6. The shield of claim 5, wherein said knee is located no more than 40 mm from said planar face.

7. The shield of claim 1, wherein said knee is located more than 1 mm radially inwardly of an edge of said target between said planar face and said beveled outer periphery.

8. The shield of claim 1, further comprising:
a bottom portion connected to said straight portion behind a substrate being sputter deposited and extending horizontally towards said substrate; and
a second straight portion connected to said bottom portion and extending vertically towards said substrate.

9. A metal shield for use in a sputter reactor including a target having a planar face and a beveled outer periphery, said shield comprising a slanted portion extending along and apart from the beveled outer periphery to form a plasma dark space and a straight portion extending away from said target and in a direction perpendicular to said planar face and joined to said slanted portion by a knee, wherein said knee is located at least 1 mm radially inwardly from an edge of said target between said planar face and said beveled outer periphery.

10. The shield of claim 9, wherein said target includes a ferromagnetic target portion.

11. The shield of claim 10, wherein said ferromagnetic target portion comprises cobalt.

12. The shield of claim 9, wherein said slanted portion is substantially conically shaped.

13. The shield of claim 9, wherein said knee is located no more than 1 cm radially inwardly of said edge.

14. The shield of claim 9, wherein said knee is located at least 9 mm away a face of said target.

15. The shield of claim 9, further comprising:
a bottom portion connected to said straight portion behind a substrate being sputter deposited and extending horizontally towards said substrate; and
a second straight portion connected to said bottom portion and extending vertically towards said substrate.

16. A sputter reactor, comprising:
a vacuum chamber;
a support within said chamber for holding on a support surface a substrate to be sputter coated;
a target on a side of said chamber in opposition to said support surface comprising a material to be sputter deposited and configured to be connected to a power supply and including a beveled side edge;
a metal shield within said chamber held at a predetermined potential and including:
a slanted portion extending along and apart from said beveled side edge with a gap therebetween forming a plasma dark space, and
a straight portion extending from said target to an elevation in back of said support surface and connected to said slanted portion at a knee,
wherein said knee is located at least 9 mm away from said target.

17. The reactor of claim 16, wherein said knee is located at least 21 mm away from said target.

18. The reactor of claim 16, wherein said knee is located no more than 40 mm away from said target.

19. The reactor of claim 16, wherein said knee is located more than 1 mm radially inside of a corner of said target between a substantially planar face thereof and said beveled side edge.

20. The reactor of claim 19, wherein said knee is located no more than 1 cm radially inside of said corner.

21. The reactor of claim 16, wherein said knee is located inwardly of the beveled side edge of said target.

22. The reactor of claim 16, wherein said target comprises a ferromagnetic material.

23. The reactor of claim 22, wherein said ferromagnetic material comprises cobalt.

24. The reactor of claim 22, wherein said ferromagnetic material comprises nickel.

25. The reactor of claim 16, wherein said target is biasable at a negative DC potential and said shield is grounded.

* * * * *